(12) United States Patent
Bauer et al.

(10) Patent No.: US 7,812,373 B2
(45) Date of Patent: Oct. 12, 2010

(54) MUGFET ARRAY LAYOUT

(75) Inventors: Florian Bauer, Munich (DE); Klaus von Arnim, Herzhorn (DE)

(73) Assignee: Infineon Technologies AG, Neubiberg (DE)

( * ) Notice: Subject to any disclaimer, the term of this patent is extended or adjusted under 35 U.S.C. 154(b) by 236 days.

(21) Appl. No.: 11/674,060

(22) Filed: Feb. 12, 2007

(65) Prior Publication Data

US 2008/0191282 A1 Aug. 14, 2008

(51) Int. Cl.
*H01L 27/10* (2006.01)
(52) U.S. Cl. .................. 257/206; 257/353; 257/365; 257/903; 257/E27.098; 716/2
(58) Field of Classification Search .............. 257/206, 257/E27.098, 353, 365, 903; 716/2
See application file for complete search history.

(56) References Cited

U.S. PATENT DOCUMENTS

| 4,125,854 | A  | * | 11/1978 | McKenny et al. ........... 257/379 |
| 6,867,460 | B1 | * | 3/2005  | Anderson et al. ........... 257/351 |
| 6,924,178 | B2 |   | 8/2005  | Beintner |
| 6,924,560 | B2 |   | 8/2005  | Wang et al. |
| 6,967,351 | B2 |   | 11/2005 | Fried et al. |
| 6,970,373 | B2 |   | 11/2005 | Datta et al. |
| 6,977,837 | B2 |   | 12/2005 | Watanabe et al. |
| 2004/0099885 | A1 | * | 5/2004 | Yeo et al. .................... 257/208 |
| 2005/0073060 | A1 | * | 4/2005 | Datta et al. .................. 257/903 |
| 2005/0094434 | A1 |   | 5/2005 | Watanabe et al. |
| 2005/0136582 | A1 | * | 6/2005 | Aller et al. ................... 438/197 |
| 2006/0289945 | A1 | * | 12/2006 | Nii .............................. 257/393 |
| 2007/0077743 | A1 | * | 4/2007 | Rao et al. ..................... 438/595 |
| 2008/0042171 | A1 | * | 2/2008 | Mosler et al. ................ 257/288 |
| 2008/0179682 | A1 | * | 7/2008 | Bauer et al. .................. 257/365 |

OTHER PUBLICATIONS

Doyle, B , et al., "Tri Gate Fully Depleted SMOS Transistors: Fabrication, Design and Layout", *2003 Symposium on VLSI Technology, Digest of Technical Papers*, (2003),2 pgs.

Yang, F.-L. , et al., "35 nm CMOS FinFETS", *2002 Symposium on VLSI Technology, Digest of Technical Papers*, (2002),2 pgs.

Yu, B. , et al., "FinFET Scaling to 10 nm Gate Length", *Digest, International Electron Devices Meeting (IEDM '02)*, (2002),4 pgs.

* cited by examiner

*Primary Examiner*—Tu-Tu V Ho
(74) *Attorney, Agent, or Firm*—Infineon Technologies Patent Department

(57) ABSTRACT

A circuit array includes a plurality cells, wherein each cell has at least one group of odd fins. The cells may be arranged in a repeating pattern that includes mirror images of the pattern. A plurality of fin forming regions are provided about which the fins are formed for the dual fin and single fin transistors.

26 Claims, 4 Drawing Sheets

MUGFET ARRAY LAYOUT

BACKGROUND

For dense array style circuit layouts, such as static random access memories (SRAMs), a small cell is desired. In multi gate field effect transistor (MuGFET) technologies, a core cell area is constrained by the distance between two fins (fin pitch) and the number of fins used per device. There is a desire to reduce the area needed for core cells using MuGFET technologies.

Two fabrication processes have been used to produce fins that yield a small distance between fins, referred to as fin pitch. In one method, multiple sacrificial spacers are first formed. Fins are then formed on the sides of the spacers. This results in an even number of fins. A similar process using altPSM (alternating phase shift modulation) where each fin has to contain a boundary between a 0° and 180° phase shifting area also results in an even number of fins.

These processes provide a small fin pitch. Each fin is defined by a spacer or closed boundary in the case of PSM. For convenience, the term spacer is used, but also applies to the PSM method. It is therefore not possible to build fins in-between two spacer structures. Thus, it is not possible to build transistor stacks consisting of transistors with an odd number of fins. Single fin devices require the use of additional complex clean-out steps, resulting in inefficient use of chip area.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

A placement of fin forming regions, such as spacer or alternating phase shift regions spanning multiple core cells enables fabrication of an array of circuits, such as SRAM cells with single-fin PMOS (p-type metal oxide semiconductor) load and NMOS (n-type metal oxide semiconductor) access devices. The fins are structures that have a very small pitch or spacing between them and the layout yields a good overall area for the cell layout. In a further embodiment, other small structures may be formed with the spacer or alternating phase shift regions.

Figure 1:
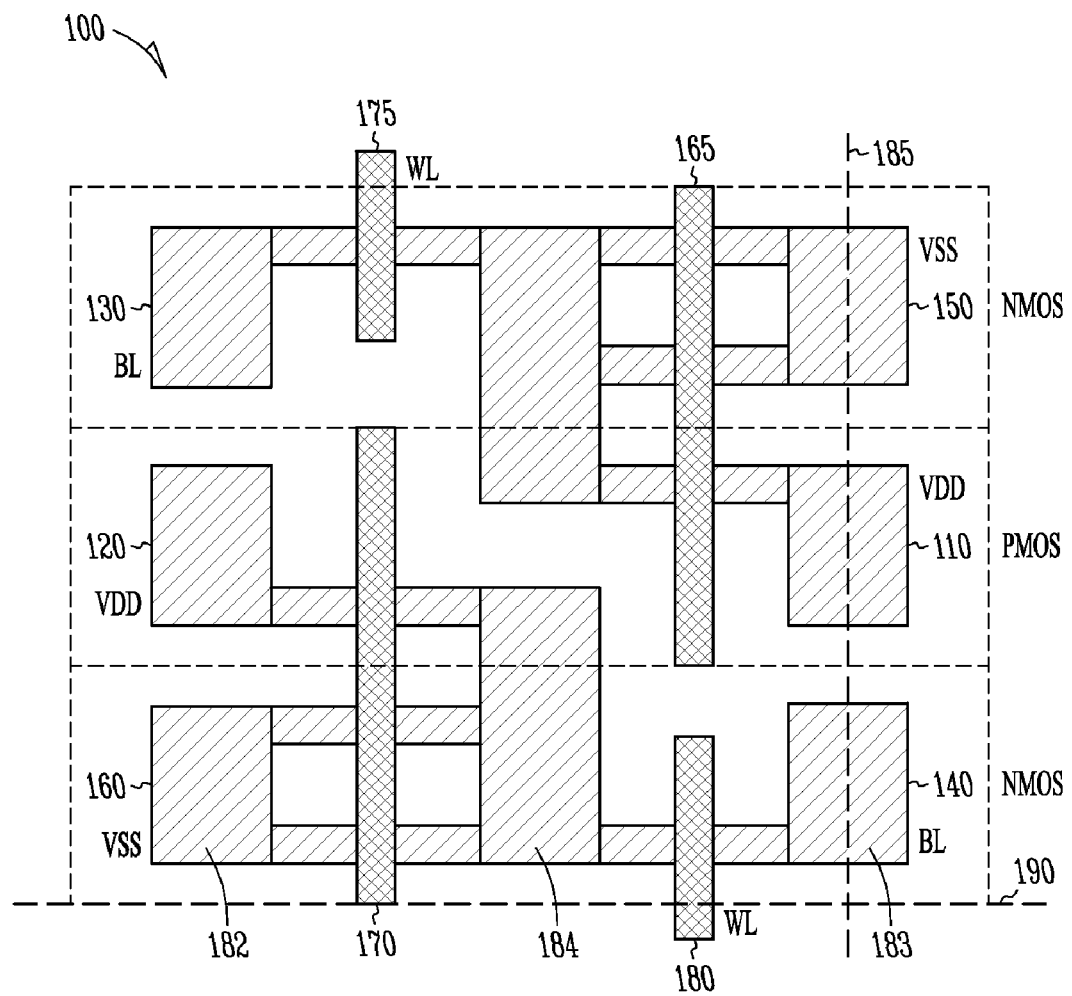
FIG. 1 is an example SRAM core cell layout using single and dual fin transistors according to an example embodiment.

FIG. 1 is an example SRAM core cell layout 100 using single and dual fin transistors according to an example embodiment. The SRAM layout 100 includes two single-fin PMOS pull up or load devices 110, 120 and two single-fin NMOS access devices 130, 140. NMOS pull-down devices 150, 160 are implemented as dual-fin devices for increased cell stability. Pull up devices 110, 120 may be coupled to VDD (voltage drain drain). Pull down devices 150, 160 may be coupled to VSS (voltage source source).

A cross coupled inverter with access devices is formed. Gates for the transistors are formed across the fins, and include inverter gates 165, 170 and gates 175, 180 for control by a word line (WL) to couple bit lines (BL and /BL) to the cross coupled inverter for reading and writing data. Source regions 182 are indicated on the left side of the layout 100 in one embodiment. Drain regions are indicated at 183 on the right side. A center region 184 forms shared source and drain regions for the transistors.

Cell 100 thus has a center portion having two single-fin PMOS load devices 110 and 120 arranged in reverse mirror images of each other, diametrically opposed and reversed single-fin NMOS access devices 130 and 140 disposed about the center portion, and diametrically opposed NMOS pull-down devices 150 and 160 opposite the single-fin PMOS load devices disposed about the center portion. The devices may be coupled such as by metalization to form a cross coupled inverter static random access memory.

To form an array of cells using the core cell, a first mirror axis 185 extending through drain region 183 illustrates a line about which a copy of the layout may be thought to be rotated to form an adjacent cell to the right of cell 100. A second mirror axis 190 at the bottom of the cell 100 illustrates a line about which a copy of the layout may be thought to be rotated to form an adjacent cell below cell 100.

Figure 2:
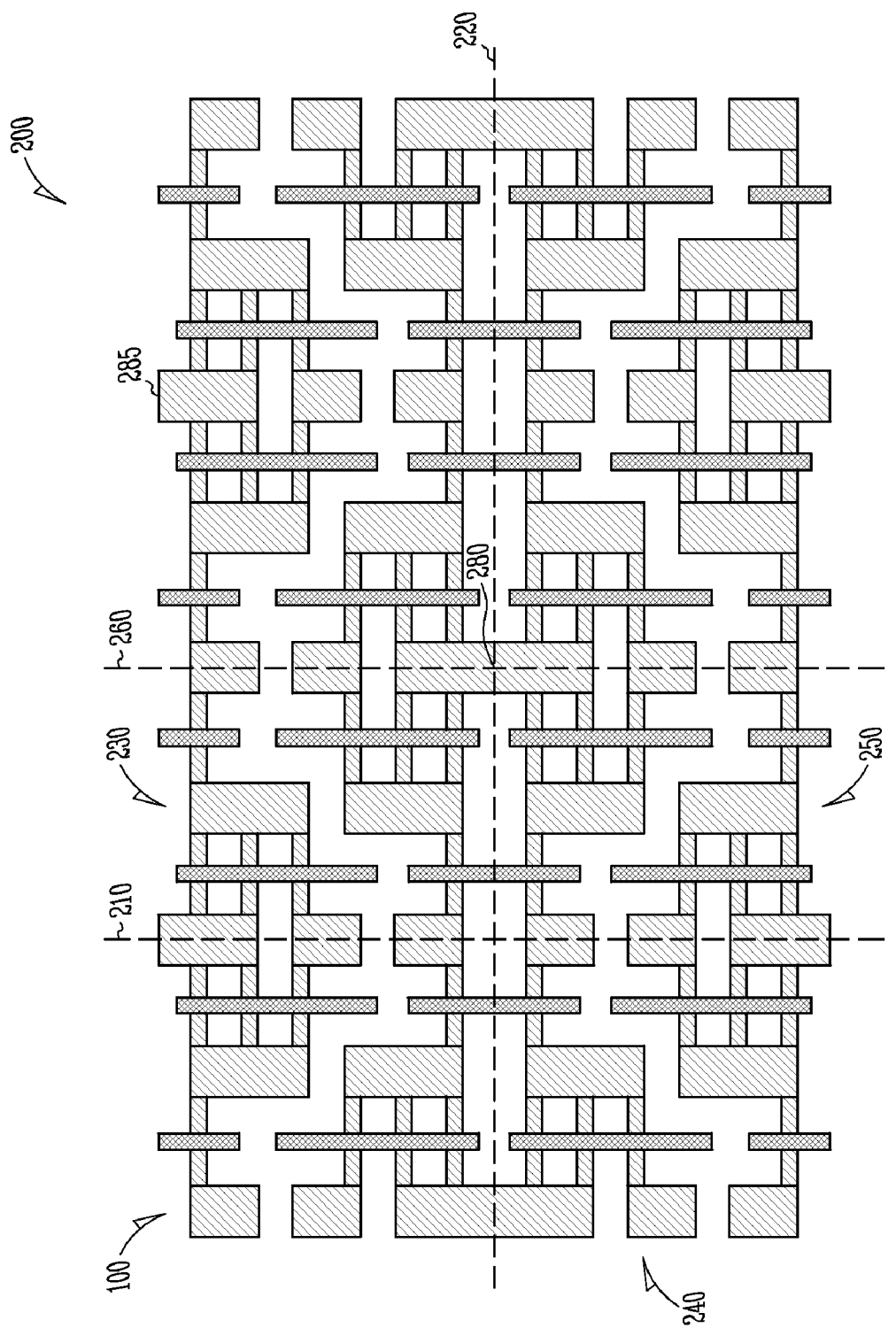
FIG. 2 is an example multiple core cell array using multiple mirror images of the core cell layout of FIG. 1 according to an example embodiment.

The single SRAM cell in one embodiment is thus replicated to form an array of SRAM cells. FIG. 2 is an example multiple core cell array 200 using multiple mirror images of the core cell layout of FIG. 1 according to an example embodiment. Each cell is essentially a mirror image of every other cell to which it is adjacent. As illustrated in FIG. 1, an imaginary axis about which a copy of the cell is rotated may result in the sharing of source/drain regions by adjacent cells without the need to duplicate the entire region.

In one embodiment, the SRAM array includes a core cell 100 having a six transistor layout with two single fin PMOS load or pull-up devices, two single fin NMOS access devices and two dual-fin NMOS pull-down devices. Multiple adjacent cells 230, 240, 250 have the same layout as the core cell, or a mirror image layout of the core cell and share at least one source and/or drain region such that each cell is a mirror image of cells that are adjacent to it. In a further embodiment, the NMOS and PMOS devices may be switched, such that there are NMOS load devices and PMOS access devices and pull-down devices.

Referring again to the SRAM example embodiment, special placement of fin forming regions, such as spacer structures or alternating phase shift areas spanning the multiple core cells enables the fabrication of the array 200 of SRAM cells with single-fin PMOS load and NMOS access devices. In one embodiment, the fin forming regions are closed polygons, and fins are formed on the sides of such polygons and may be etched as desired. Using such fin forming regions, the fin pitch may be very small, yielding an efficient cell layout. The first and second axis shown in FIG. 1 are extended at 210 and 220 respectively in FIG. 2 to illustrate the mirrored relationship of adjacent cells. A cell 230 is shown to the right of cell 100, and is a mirror image of cell 100 about axis 210. A cell 240 is shown below cell 100, and is a mirror image of cell 100 about axis 220. A forth cell in the four cell layout is seen at 250, and is a mirror image of both cell 230 about axis 220 and cell 240 about axis 210. Further cells may be formed, such as by mirroring the four cells described about axis 260 to form an 8 cell device. Still further cells may be formed in any desired direction by continuing the mirroring process, either with individual cells or groups of cells. Gates are also mirrored as illustrated.

The layout 200 also facilitates placement of a VSS contact at intersections of replicated cells where the pull down transistors 150, 160 share areas, such as at 280 and 285 for example. A wordline contact may be shared between two cells along axis 210. Bit lines may also be provided horizontally and shared between two cells.

Figure 3A:
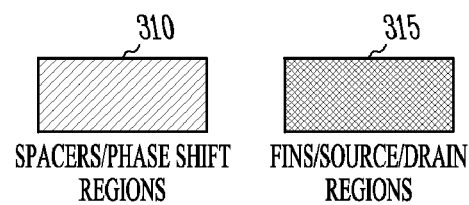
FIG. 3A is a key indicating shading for certain regions of FIGS. 3B, 3C, 4A and 4B.

FIG. 3A illustrates a key for identifying different regions in FIGS. 3B, 3C, 4A and 4B. Spacers or alternating phase shift regions are shaded as illustrated at 310. Fins, source and drain regions are shaded as illustrated at 315.

Figure 3B:
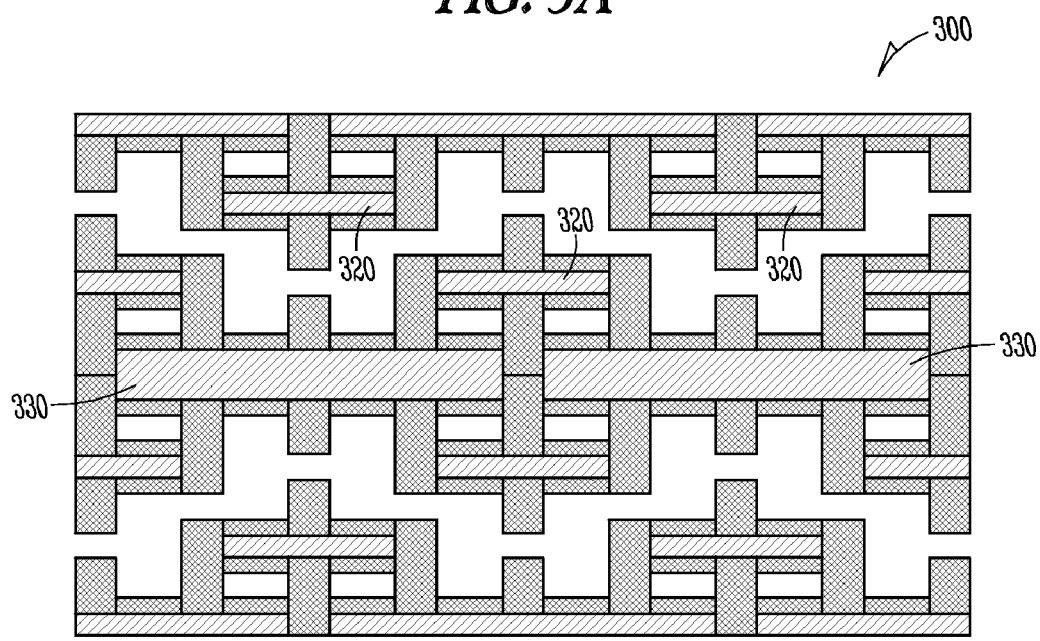
FIG. 3B is an example arrangement of regions used to define fin structures for the core cell layout of FIG. 2.

FIG. 3B is an example arrangement or layout 300 of regions, such as spacers or alternating phase shift regions used to define fin structures for the core cell layout of FIG. 2. Gates are not illustrated for simplicity. Fin forming regions are identified with the shading 310, and the fins and source and drain regions are illustrated with the shading 315. Note that there are many open spaces between the fin forming regions. There are generally two types of fin forming regions illustrated. Narrow or thin fin forming regions, such as indicated at 320 may be used to form sets of narrow pitched fins. The thin fin forming regions define the pitch of the fins, as the fins form on the sides of the fin forming regions. Some typical thin fin forming region thicknesses are approximately 50 nanometers in current embodiments. Further embodiments may be larger or smaller as desired and as fabrication processes improve. Heights are generally the same as is desired for the fin height. In some embodiments, multiple such fins may be formed for transistors having more than two fins. Note that not all the fin forming regions are numbered to avoid a cluttered drawing.

Wider or thick fin forming regions 330 may also be used to form widely spaced fins. The width may vary significantly, but may be selected to provide sufficient spacing between devices to both conserve chip space, yet allow further processing such as contact formation. Via a combination of wide and narrow fins, along with wide and narrow open spaces, fins in desired layouts may be obtained. Thus, the single fin transistors or odd numbered fin transistors or portions of the cell having an odd number of fins may be formed via a combination of wide and narrow fin forming regions, wide and narrow open spaces, and mirrored replication of adjacent cells, providing an efficient use of chip area. In some embodiments, a single width of spacers may be used. Shared source and drain areas further result in conservation of chip area.

Figure 3C:
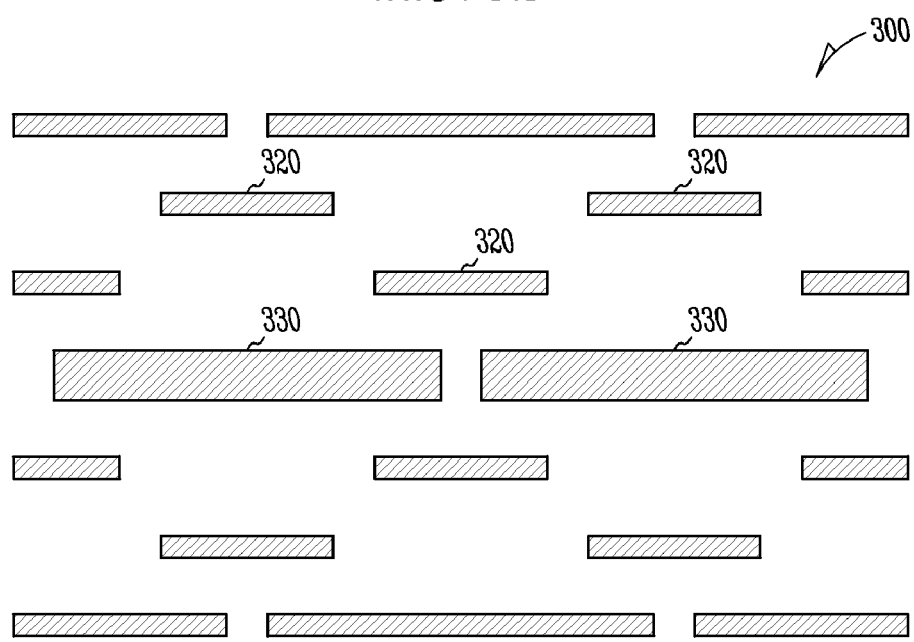
FIG. 3C illustrates spacers or alternating phase shift regions used to define fin structures for the core cell layout of FIG. 2.

FIG. 3C illustrates the fin forming regions used to define fin structures for the core cell layout of FIG. 2 prior to formation of the fin, drain and source regions. The fin forming regions are identical to those in FIG. 3B.

At the edges of arrays, special termination structures are commonly used in standard lithographic processes. In one embodiment, such structures may be created, or an additional dummy cell may be used to ensure a very uniform structure within the array. To avoid electrical shorts at the edges of the array, these dummy cells or structures may be coarsely masked and etched to form a trench around the array.

Figure 4A:
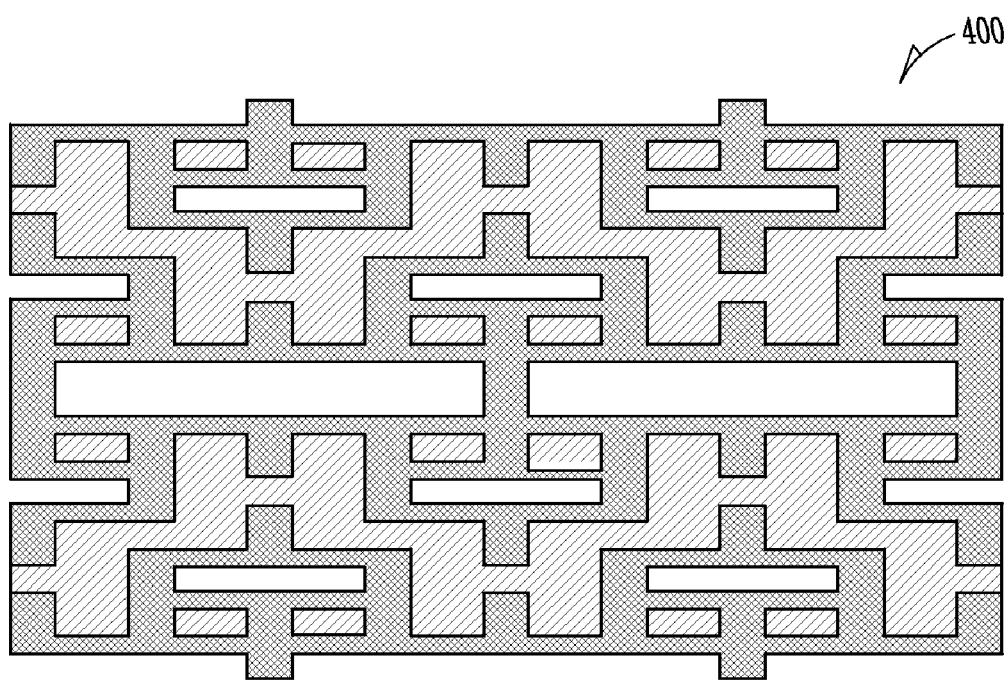
FIG. 4A is an example alternative arrangement of regions used to define fin structures for the core cell layout of FIG. 2.

FIG. 4A is an example alternative arrangement or layout 400 of regions used to define fin structures for the core cell layout of FIG. 2. Note that in the previous fin forming region layout 300, there were many open spaces. In the layout 400, the fin forming regions replace the open spaces, and the open spaces now exist in place of the fin forming regions of the layout 300. In essence, layouts 400 and 300 are negative images of each other, taking into account the fin, source and drain regions. Thus, the single fin transistors are formed via a combination of wide and narrow fin forming regions, wide and narrow open spaces, and mirrored replication of adjacent cells, providing an efficient use of chip area. Shared source and drain areas further result in conservation of chip area.

Figure 4B:
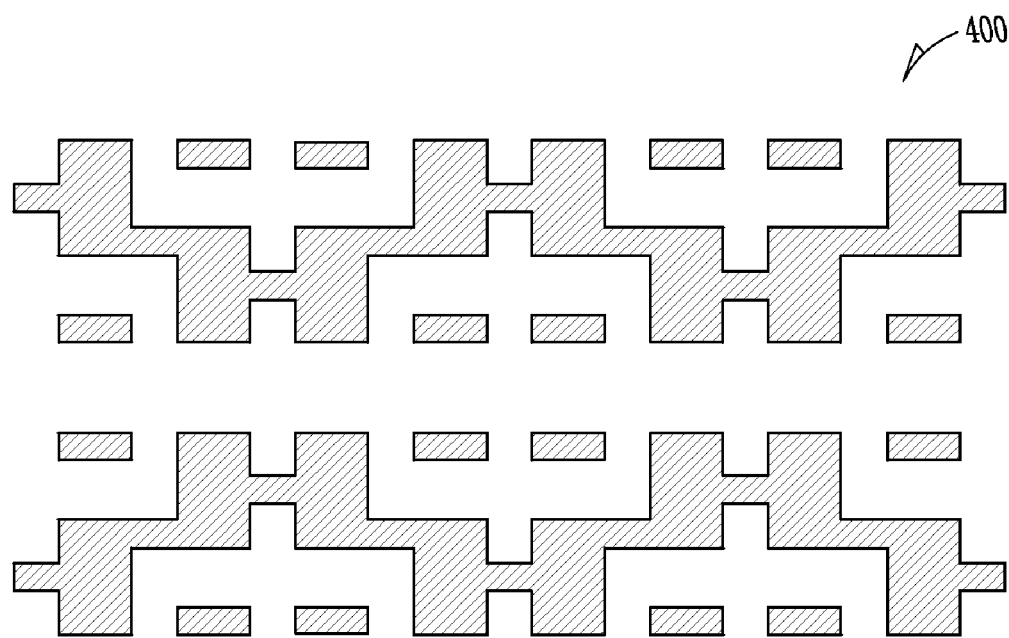
FIG. 4B illustrates alternative spacers or alternating phase shift regions used to define fin structures for the core cell layout of FIG. 2.

FIG. 4B illustrates the fin forming regions used to define fin structures for the core cell layout of FIG. 2 prior to formation of the fin, drain and source regions. The fin forming regions are identical to those in FIG. 4A.

As previously indicated, the fin forming regions may correspond to spacer structures spanning multiple SRAM cells to define the fins. In one embodiment, at least one fin forming region may be adapted to form fins of different transistors in different cells.

Two equivalent arrangements are shown. Instead of a spacer, the same scheme may be employed for the alternating phase shift regions by defining fins via alternating phase shift masks. The fin forming regions may also correspond to still further methods of defining structures that involve the use of closed polygons, where the closed polygon structures may be used to define structures that may not be easily formed using common lithographic processes.

In still further embodiments, the method of laying out arrays may be applied to devices other than six transistor SRAM devices. The method may also be applicable to other structures that are formed by closed polygon thin feature forming regions, where the structures may be replicated in arrays. In some embodiments, at least one such structure has an odd number of thin features.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A circuit layout comprising:
   a plurality of cells, wherein each cell has at least one multi gate field effect transistor comprising a plurality of fins, the cells being arranged in a repeating pattern that includes mirror image of the pattern about a first axis and a mirror image of the pattern about a second axis; and
   a plurality of closed fin defining structures abutting side surfaces of the plurality of fins, wherein the at least one of the plurality of closed fin defining structures spans at least two of the plurality of cells.

2. The circuit layout of claim 1 wherein at least one of the plurality of closed fin defining structures is located between at least two of the plurality of fins of one of the at least one multi gate field effect transistor.

3. The circuit layout of claim 1, wherein the plurality of closed fin defining structures comprises a plurality of narrow fin defining structures and wherein the plurality of fins comprises a plurality of narrow pitched fins.

4. The circuit layout of claim 1, wherein the plurality of closed fin defining structures comprises a plurality of wide fin defining structures and wherein the plurality of fins comprises a plurality of widely spaced fins.

5. The circuit layout of claim 1 wherein the plurality of closed fin defining structures are spacers abutting side surfaces of the plurality of fins.

6. The circuit layout of claim 1 wherein the plurality of closed fin defining structures are alternating phase shift regions, wherein the alternating phase shift regions form alternative phase shift masks by which the plurality of fins are defined.

7. The circuit layout of claim 1 wherein the plurality of closed fin defining structures comprises a plurality of wide fin defining structures and a plurality of narrow fin defining structures.

8. The circuit layout of claim 1 wherein each cell has at least one multi gate field effect transistor comprising a single fin and at least one multi gate field effect transistor comprising two fins.

9. The circuit layout of claim 1, wherein the plurality of closed fin defining structures are a plurality of closed polygons.

10. The circuit layout of claim 1, wherein the plurality of closed fin defining structures are formed prior to the odd number of fins are formed.

11. The circuit layout of claim 1 wherein at least one of the plurality of closed fin defining structures is located between one of the plurality of fins of a first transistor of the at least one multi gate field effect transistor and one of the plurality of fins of a second transistor of the at least one multi gate field effect transistor.

12. A static random access memory (SRAM) array comprising:
   a core cell formed of multi gate field effect transistors having fins, wherein at least a portion of the cell has a plurality of fins;
   multiple adjacent cells having the same layout as the core cell and sharing at least one of source and/or drain region, wherein each cell is a mirror image of cells that are adjacent to it about a first axis and about a second axis;
   a plurality of closed fin defining structures abutting side surfaces of the plurality of fins, wherein the at least one of the plurality of closed fin defining structures spans at least two of the multiple adjacent cells.

13. The SRAM array of claim 12 wherein the plurality of closed fin defining structures comprises a plurality of narrow fin defining structures abutting side surfaces of a plurality of narrow pitched fins and a plurality of wide fin defining structures abutting side surfaces of a plurality of widely spaced fins.

14. The SRAM array of claim 12 wherein the fins of the transistors are arranged in parallel regions and are selectively coupled by gates running through the regions.

15. The SRAM array of claim 12 wherein a center of the layout provides a supply connection.

16. The SRAM array of claim 12 wherein the plurality of closed fin defining structures is a plurality of closed polygons.

17. The SRAM array of claim 12 wherein the core cell is formed of at least one multi gate field effect transistor having a single fin and at least one multi gate field effect transistor having two fins.

18. The SRAM array of claim 12 wherein at least one of the plurality of closed fin defining structures is located between at least two of the plurality of fins of the at least one multi gate field effect transistor.

19. A circuit layout comprising:
   a plurality of cells, wherein each cell has at least one multi gate field effect transistor comprising an plurality of fins, the cells being arranged in a repeating pattern that includes mirror images of the pattern about a first axis and about a second axis; and
   a plurality of closed fin defining structures abutting side surfaces of the plurality of fins, wherein at least one of the plurality of closed fin defining structures is located across at least two of said plurality of cells.

20. The circuit layout of claim 19 wherein said at least one of the plurality of closed fin defining structures abuts side surfaces of a first fin for a first transistor in one of said at least two of said plurality of cells and side surfaces of a second fin for a second transistor in another of said at least two of said plurality of cells.

21. The circuit layout of claim 19 wherein each cell has at least one multi gate field effect transistor comprising a single fin and at least one multi gate field effect transistor comprising two fins.

22. The circuit layout of claim 19 wherein said at least one of the plurality of closed fin defining structures abuts side surfaces of a first fin of one of the at least one multi gate field effect transistor and side surfaces of a second fin of the one of the at least one multi gate field effect transistor.

23. A circuit layout comprising:
   a plurality of closed fin defining structures located across a plurality of cells, wherein the plurality of closed fin defining structures comprises at least one of a narrow fin defining structure or a wide fin defining structure;
   at least one multi gate field effect transistor in each of the plurality of cell, the at least one multi gate field effect transistor having a plurality of fins,
   wherein the at least one of a narrow fin defining structure or a wide fin defining structure abuts side surfaces of the plurality of fins.

24. The circuit layout of claim 23, wherein the plurality of closed fin defining structures comprises at least one of a narrow fin defining structure and a wide fin defining structure.

25. The circuit layout of claim 23, wherein the plurality of closed fin defining structures is a plurality of spacers abutting side surfaces of the plurality of fins.

26. The circuit layout of claim 23, wherein the plurality of closed fin defining structures is a plurality of alternating phase shift regions, wherein the alternating phase shift regions form alternative phase shift masks by which the plurality of fins are defined.

* * * * *